United States Patent [19]

Otremba et al.

[11] Patent Number: 4,922,211

[45] Date of Patent: May 1, 1990

[54] MICROWAVE OSCILLATOR IN WHICH THE DIELECTRIC RESONATOR IS HERMETICALLY SEALED

[75] Inventors: Klaus Otremba, Munich; Volker Sartorius, Puchheim, both of Fed. Rep. of Germany

[73] Assignees: Siemens Aktiengesellschaft, Berlin and Munich, Fed. Rep. of Germany

[21] Appl. No.: 318,969

[22] Filed: Mar. 6, 1989

[30] Foreign Application Priority Data

Apr. 15, 1988 [DE] Fed. Rep. of Germany ....... 3812669

[51] Int. Cl.$^5$ .............................................. H03B 5/18
[52] U.S. Cl. ..................................... 331/68; 331/96; 333/219.1
[58] Field of Search ............. 331/96, 107 DP, 107 SL, 331/117 D, 68; 333/219.1

[56] References Cited

U.S. PATENT DOCUMENTS

| | | | |
|---|---|---|---|
| 4,588,964 | 5/1986 | Hirai et al. | 331/96 X |
| 4,609,883 | 9/1986 | Mizumura et al. | 331/96 |
| 4,628,283 | 12/1986 | Reynolds | 331/117 D X |
| 4,733,198 | 3/1988 | Blickstein et al. | 331/96 |

FOREIGN PATENT DOCUMENTS

2931428 C2  3/1982  Fed. Rep. of Germany .

Primary Examiner—Siegfried H. Grimm
Attorney, Agent, or Firm—Hill, Van Santen, Steadman & Simpson

[57] ABSTRACT

A microwave oscillator which has a dielectric resonator which has properties which are dependent on the atmospheric humidity and which should be sealed in a hermetically air tight container to eliminate variations in its characteristics. The dielectric resonator is mounted in a hermetically sealed air tight cavity inside a metal housing in which the electrical circuit is mounted and is arranged at a position relative to coupling elements on a film printed circuit board which has a metallized surface on one side thereof.

13 Claims, 3 Drawing Sheets

MICROWAVE OSCILLATOR IN WHICH THE DIELECTRIC RESONATOR IS HERMETICALLY SEALED

BACKGROUND OF THE INVENTION

1. Field of the Invention

This invention is directed to a microwave oscillator which includes a dielectric resonator that is electromagnetically coupled to an electrical circuit and which is hermetically sealed.

2. Description of the Related Art

German DE 29 31 428 C2 discloses a microwave oscillator which includes a cavity resonator and a solid state component which is coupled to the cavity resonator. The solid state component is arranged on a metallic base plate that is covered by the pot-shaped resonator and the ground terminal is conductively attached to a threaded foot which is secured to the base plate.

In oscillators which include dielectric resonators, the properties depend on the atmospheric humidity and the resonant frequency and the quality of the dielectric resonators, among other factors, are functions of the atmospheric humidity which surround them.

The object of the invention is to create an oscillator comprising a dielectric resonator whose properties are independent of the atmospheric humidity and that enables manufacture wherein the dielectric resonator is not mechanically rigidly attached to the oscillator until the end of the manufacturing sequence.

SUMMARY OF THE INVENTION

It is an object of the invention to provide a dielectric resonator in a hermetically tight cavity inside a metal housing in which the electrical circuitry is mounted and located at a position relative to coupling elements which are mounted on a film printed circuit board which supports the electrical circuitry and which is metallized over its surface on one side.

It is another object to provide an improved microwave oscillator.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
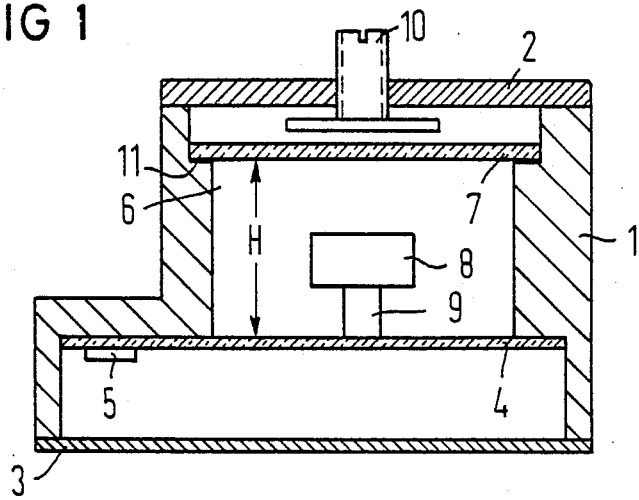
FIG. 1 is a sectional view of a microwave oscillator of the invention and shows the hermetically sealed dielectric resonator.

FIG. 1 is a sectional view which shows a microwave oscillator which includes a hermetically sealed dielectric resonator 8. A metal housing 1 is open at both sides and is closed by metal covers 2 and 3. The metal housing 1 is formed with an offset step, so that the lower region has a larger cross-section than an upper region. A film printed circuit board 4 is mounted in the lower region and the film circuit board 4 has its backside metallized and facing toward the upper region of the metal housing and the lower side carries the elements of the active oscillator circuit, for example the transistor 5 as well as the coupling elements on its front or lower side. The coupling elements allow electromagnetic coupling with a dielectric resonator 8 which is mounted in the upper region of the metal housing through openings formed in the metallization on the upper or backside of the film printed circuit board 4. The film printed circuit board 4 has its metallized backside seated on shoulders formed in the inside wall of the metal housing as shown and is soldered thereto. The dielectric resonator 8 is mounted in, for example, a cylindrical cavity 6 which is laterally surrounded by the walls of the metal housing 1 is terminated on its lower side by the film printed circuit board and on its upper side by a silica glass plate 7 which is spaced a distance H from the film printed board 4 on an annular step-shaped shoulder of the inside wall of the metal housing 1 and the plate 7 is glued by glue 11 to the shoulder. The film printed circuit board 4 is soldered to the metal housing 1 and the silica glass plate 7 is glued to the metal housing 1 to form a hermetically tight cavity for the dielectric resonator 8. The dielectric resonator 8 is glued to the film printed circuit board 4 with a glass pin 9. Further, a tuning element 10 for fine tuning is provided which is formed of a threaded pin which mates with a threaded opening in the upper metal cover 2 and which carries a disc, for example, a metal disc attached to its end face. The disc is moveable in the cavity between the metal cover 2 and the silica glass plate 7 and thus influences the resonant frequency of the dielectric resonator 8.

Figure 2:
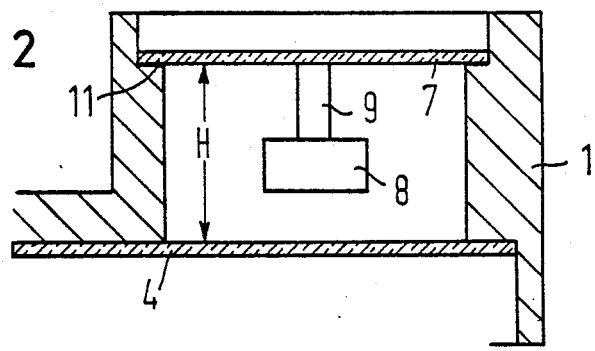
FIG. 2 is a sectional view illustrating a modification of the invention.

FIG. 2 is a partial sectional view of a modified form of a microwave oscillator that is shown in FIG. 1. This embodiment differs from the FIG. 1 embodiment in that the dielectric resonator 8 is attached by glue to the glass plate 7 with the glass rod 9. The advantage of this arrangement over the FIG. 1 embodiment is that instead of fastening the resonator 8 to the film printed circuit board 4 it is attached to the glass plate 7 and improved processing and cleaning of the dielectric resonator for frequency matching can be accomplished and an adjustment of the coupling by modifying the height H is easier to accomplish and improved monitoring of the attachment location is possible.

Figure 3:
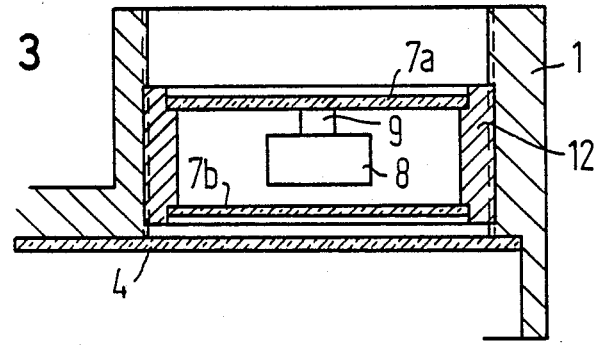
FIG. 3 is a sectional view of another embodiment.

FIG. 3 shows a partial sectional view of another embodiment of a mounting and humidity seal for the dielectric resonator 8 wherein the dielectric resonator 8 is mounted in a hermetically sealed air tight housing that is formed of a metallic threaded ring 12 which can be introduced into the upper region of the metal housing 1. Glass plates 7a and 7b are mounted on both ends over the openings of the ring 12 so as to form a sealed cavity. The resonator 8 is attached by the glass rod 9 to plate 7a. The advantage of this arrangement is that simple processing and cleaning of the dielectric resonator 8 before the housing is closed can be done under optimum test condition due to the sealed condition and simple adjustments of the electrical coupling and repair of the oscillator can be done by threadedly removing the threaded ring 12 from the housing 1.

Figure 4:
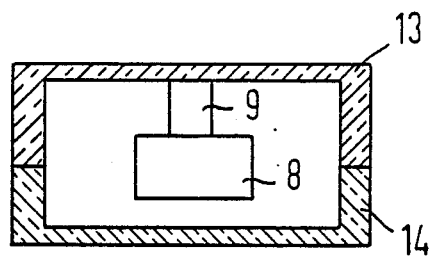
FIG. 4 is a sectional view of yet another embodiment.
Figure 5:
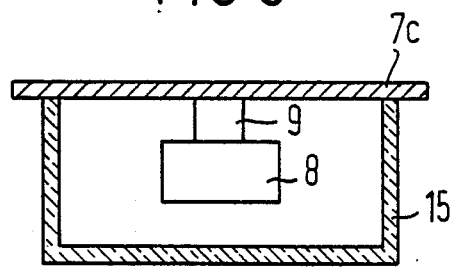
FIG. 5 is a sectional view of another embodiment.

FIGS. 4 and 5 are sectional views of specific shapes of hermetically sealed units in tight housings for the dielectric resonator 8 and support 9 which allow electrical coupling through the wall of glass cylinder walls. These two embodiments are usually used for coupling through the floor of the housing and the housing is in FIG. 4 formed of glass with two cup-shaped half shells 13 and 14 arranged with their end faces against one another and glued together in the exemplary embodiment of FIG. 4. In the exemplary embodiment of FIG. 5 a pot-shaped glass container 15 has a cover plate 7c which is glued thereto. The dielectric resonator 8 is secured to the upper portion of the housing with the glass rod 9.

Figure 6A:
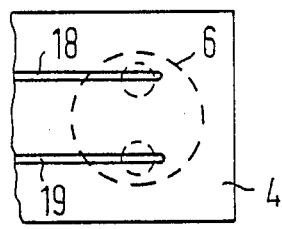
FIG. 6A is a top plan view which shows the coupling of the dielectric resonator to the electrical circuit on the printed circuit board.
Figure 6B:
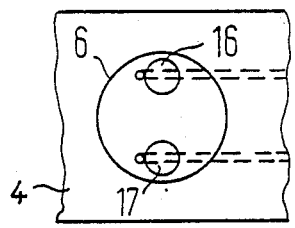
FIG. 6B is a bottom plan view of the structure of FIG. 6A.

FIGS. 6A, 6B, 7A, 7B, 8A, 8B, 8C, 9A and 9B show partial plan views of various embodiments for the coupling of the dielectric resonator 8 to the electrical circuit on the film printed circuit board. The respective region of the film circuit board 4 which lies in the region of the cavity containing the dielectric resonator 8 is shown in front views in FIGS. 6A, 7A, 8A and 9A and in back views in FIGS. 6B, 7B, 8B and 9B. The contour of the cavity is shown as a dot-dashed circuit in the front side view and as a solid-line circuit in the back side view. Recesses 16, 17 are formed in the front side of the film circuit board 4 in the region of the coupling elements and are formed on the back side which is metallized over the entire surface. Interconnects 18 and 19 extend over the recesses 16, 17 on the opposite, front side of the film printed circuit board 4 and the interconnects 18, 19 then are through-contacted to the metallized back side of the film printed circuit board 4 and are conducted to ground (FIGS. 6A and 6B).

Figure 7A:
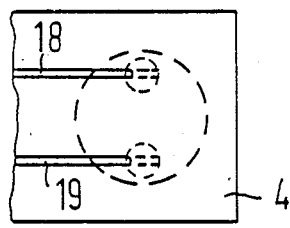
FIG. 7A is a top plan view of a modification of the coupling.
Figure 7B:
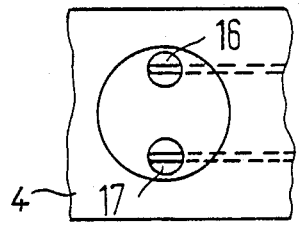
FIG. 7B is a bottom view of the structure of FIG. 7A.
Figure 8A:
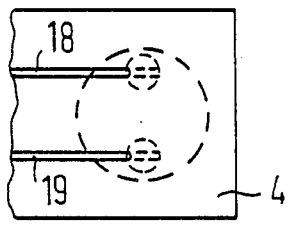
FIG. 8A is a top plan view of a modification of the coupling.
Figure 8B:
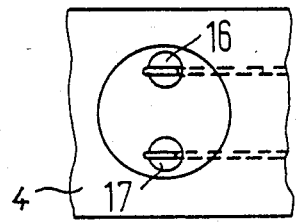
FIG. 8B is a bottom plan view of the coupling of FIG. 8A.
Figure 8C:
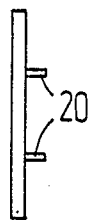
FIG. 8C is a side plan view.

In a modification, the through-contacted end regions of the microstrip lines 18, 19 in the exemplary embodiment of FIGS. 7A and 7B are formed as a coupling loop and, in the exemplary embodiment of FIGS. 8A, 8B and 8C are formed as a wire loop 20 which extends into the cavity 6.

Figure 9A:
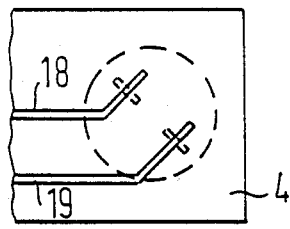
FIG. 9A is a top plan view of another coupling.
Figure 9B:
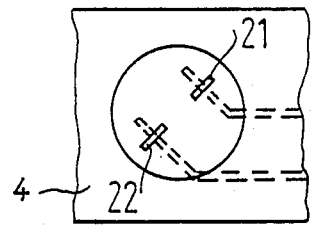
FIG. 9B is a bottom view plan of the coupling of FIG. 9A.

FIGS. 9A and 9B illustrate a coupling for the dielectric resonator 8 which is in the form of a slot coupling. The end regions of the microstrip lines 18, 19 are angled so that they extend perpendicularly relative to slot-like recesses 21, 22 formed in the opposite, metallized backside of the film printed circuit board 4.

The coupling shown in FIGS. 7A and 7B represents a preferred embodiment because, first, a rigid coupling to the dielectric resonator 8 is possible and, second, overcoupling from one coupling location to another is relatively small. In order to entirely avoid such disruptive overcoupling between the individual coupling locations, it is advantageous to insert shielding partitions between the individual coupling locations on the side of the film printed circuit board 4 on which the components are mounted. To accomplish this, the space between the film printed circuit board 4 and the lower metal cover 3 can be divided into individual chambers into which individual sections of a multiply subdivided film printed circuit board are inserted.

The inventive embodiments of the microwave oscillator which are shown allow the adjustment of the electromagnetic coupling between the dielectric resonator 8 and an electrical circuit by making geometrical modifications of the coupling elements or by varying the mechanical distance between the dielectric resonator 8 and the electrical circuit. The dielectric resonator 8 is efficiently and permanently protected against atmospheric humidity changes. The connecting locations which are solder surfaces and glued locations can be easily observed. In an embodiment of the dielectric resonator 8, its mechanical connection to the electrical circuit can occur during the final testing procedures and cleaning the dielectric resonator which is subsequently necessary is possible.

Although the invention has been described with respect to preferred embodiments, it is not to be so limited as changes and modifications can be made which are within the full intended scope as defined by the appended claims.

We claim as our invention:

1. A microwave oscillator comprising, a dielectric resonator, an electrical circuit on a printed circuit board electromagnetically coupled to said dielectric resonator, said dielectric resonator mounted in a hermetically sealed air tight space inside a metal housing to which said circuit board is mounted, and dielectric resonator coupling elements to couple energy between said resonator and said electrical circuit formed on said printed circuit board which has one side upon which components are formed and which has a second side which is metallized over its entire surface so as to form a ground plane and wherein said space is laterally surrounded by the side walls of said metal housing and said space is terminated by said printed circuit board on one end and by a glass plate on the second end, and wherein the insides of said metal housing are formed with step-shaped offset shoulders which are spaced a distance apart which corresponds to the height of said space and said printed circuit board and said glass plate are mounted on said shoulders.

2. A microwave oscillator according to claim 1 wherein said glass plate is glued to the side walls of said housing.

3. A microwave oscillator comprising, a dielectric resonator, an electrical circuit on a printed circuit board electromagnetically coupled to said dielectric resonator, said dielectric resonator mounted in a hermetically sealed air tight space inside a metal housing to which circuit board is mounted, and dielectric resonator coupling elements to couple energy between said resonator and said electrical circuit formed on said printed circuit board which has one side upon which components are formed and which has a second side which is metallized over its entire surface so as to form a ground plane and, wherein said dielectric resonator is mounted inside a separate, hermetically sealed air tight housing which is mounted inside said metal housing.

4. A microwave oscillator according to claim 3, wherein said air tight housing is formed of a threaded ring and of two glass plates which are attached to the ends thereof.

5. A microwave oscillator according to claim 3, wherein said air tight housing is formed of two cup-shaped half shell members of glass which have their end faces joined together.

6. A microwave oscillator according to claim 3, wherein said air tight housing is formed of a cup-shaped glass vessel and a cover plate which is attached to said cup-shaped glass vessel.

7. A microwave oscillator according to claim 2 or 1 or 3 or 4 or 5 or 6, wherein said dielectric resonator is attached with a glass pin to one of the base surfaces which terminate said space.

8. A microwave oscillator according to claim 2 or 1 or 3 or 4 or 5 or 6 including a fine tuning element mounted in a bore of a metallic cover of said metal housing and mounted between said metallic cover and the cover of said space upon which said dielectric resonator is mounted.

9. A microwave oscillator according to claim 2 or 1 or 3 or 4 or 5 or 6 wherein said metal housing has open face ends and is formed with a step-shaped offset such that the lower region has a cross section equal to said printed circuit board which is inserted therein, and the upper region of said space which contains said dielectric resonator has a smaller cross section and the end faces of the metal housing are closed with metal covers.

10. A microwave oscillator according to claim 2 or 1 or 3 or 4 or 5 or 6 wherein the coupling of said dielectric resonator to said electrical circuit occurs by microstrip lines, which extend through holes formed through said printed circuit board in the area of said space which contains said dielectric resonator.

11. A microwave oscillator according to claim 2 or 1 or 3 or 4 or 5 or 6 wherein the coupling of said dielectric resonator to said electrical circuit occurs with a coupling loop which extends through holes formed through said printed circuit board in the area of said space which contains said dielectric resonator.

12. A microwave oscillator according to claim 2 or 1 or 3 or 4 or 5 or 6 wherein the coupling of said dielectric resonator to said electrical circuit occurs with wire loops in the area of said space which contains said dielectric resonator.

13. A microwave oscillator according to claim 2 or 1 or 3 or 4 or 5 or 6 wherein the coupling of said dielectric resonator to the electrical circuit occurs with a slotted line which is coupled to a microstrip line which is formed on said one side of said printed circuit board.

* * * * *